United States Patent
Thakur et al.

(10) Patent No.: US 6,271,152 B1
(45) Date of Patent: *Aug. 7, 2001

(54) METHOD FOR FORMING OXIDE USING HIGH PRESSURE

(75) Inventors: Randhir P. S. Thakur; David L. Chapek, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/571,788

(22) Filed: May 16, 2000

Related U.S. Application Data

(63) Continuation of application No. 08/868,562, filed on Jun. 4, 1997, now Pat. No. 6,066,576.

(51) Int. Cl.$^7$ .......................... H01L 21/31; H01L 21/316
(52) U.S. Cl. .................. 438/770; 438/778; 438/773; 438/774; 438/588; 438/591
(58) Field of Search ................................ 438/770, 787, 438/773, 774, 769, 588, 591

(56) References Cited

U.S. PATENT DOCUMENTS

| | | | |
|---|---|---|---|
| 4,584,205 | * 4/1986 | Chen et al. | 438/762 |
| 4,742,016 | 5/1988 | Rhodes | 437/37 |
| 5,118,641 | 6/1992 | Roberts | 437/69 |
| 5,266,509 | 11/1993 | Chen | 437/43 |
| 5,304,829 | 4/1994 | Mori et al. | |
| 5,358,894 | 10/1994 | Fazan et al. | 437/70 |
| 5,366,917 | 11/1994 | Watanabe et al. | 437/47 |
| 5,502,009 | 3/1996 | Lin | 437/239 |
| 5,597,749 | 1/1997 | Iguchi | 437/43 |
| 5,658,814 | 8/1997 | Lee | 438/588 |
| 5,846,888 | 12/1998 | Chapek et al. | 438/770 |
| 6,066,576 | * 5/2000 | Thakur et al. | 438/787 |

OTHER PUBLICATIONS

Is there LOCOS after LOCOS? Deleonibus, S. Solid–State Electronics, vol. 41, 1997, No. 7, 1027–1039.*
High –pressure and high–temperture furnace oxidation for poly–buffered LOCOS. Kim, S.S.; Emami, A, and Deleonibus, S. Solid State Technology, Nov. 1994, 67–72.*
A High Pressure High Temperature Poly Buffer LOCOS (HP–HTPBL) Isolation Process for 1Gbit Density Non Volatile Memories. Deleonibus, S.; Martin, F.; Kim, S.S.; Emami, A.; FLorin, B.; Heitzmann, M.; and Leroux, C. Ext. Abstracts SSDM, Osaka, 1995, 893–895.*
256 Mbit High Density CMOS Non Volatile Memories Field Isolation by Using High Temperature Poly Buffer LOCOS (HTPBL). Deleonibus, S.; Spinelli, P.; Vinet, F.; Heitzmann, M.; Guegan, G. and Leroux, C. Ext. Abstracts SSDM, Yokohama, 1994, 913–915.*
Dry O(sub)2 High Pressure Field Oxidation for 0.25 micrometer Isolation Technology. Matthews, V.K.; Fazan, P.C.; Jeng, N.; Kim, S.S. and Emami, A. Ext. Abstracts SSDM, Osaka, 1995, 899–901.*

* cited by examiner

Primary Examiner—Vu A. Le
Assistant Examiner—Beth E. Owens
(74) Attorney, Agent, or Firm—Schwegman, Lundberg, Woessner & Kluth, P.A.

(57) ABSTRACT

Field oxide is formed using high pressure. Oxidation of field regions between active regions is accomplished in a two-step process. A first oxide layer is formed in the field region. Then, a second oxide layer is formed on the first oxide layer. The second oxide layer is formed at a pressure of at least approximately 5 atmospheres. In one embodiment, the first oxide layer is formed at atmospheric pressure using a conventional oxidation technique, such as rapid thermal oxidation (RTO), wet oxidation, or dry oxidation. In another embodiment, the first oxide layer is formed, at a pressure of approximately 1 to 5 atmospheres. Wet or dry oxidation is used for the oxidizing ambient. The first oxide layer is formed to a thickness of approximately 500 angstroms or less, and typically greater than 200 angstroms. Temperatures of approximately 600 to 1,100 degrees Celsius are used for the oxidation steps.

40 Claims, 4 Drawing Sheets

METHOD FOR FORMING OXIDE USING HIGH PRESSURE

This application is a continuation of U.S. application, Ser. No. 08/868,562, filed on Jun. 4, 1997 now U.S. Pat. No. 6,066,576

FIELD OF THE INVENTION

The present invention relates to methods for fabricating semiconductor integrated circuits, and in particular, to methods for isolating devices in semiconductor integrated circuits.

BACKGROUND OF THE INVENTION

Individual devices are conventionally isolated on a semiconductor substrate using a technique termed LOCal Oxidation of Silicon (LOCOS). LOCOS comprises forming a thin pad oxide layer on an underlying substrate. A blanket silicon nitride layer is then formed on the thin pad oxide layer. Silicon nitride is very slow to oxidize. Thus, if a sufficiently thick layer of silicon nitride is used as an oxidation mask, the underlying substrate is protected from oxidation. The thin pad oxide layer serves to prevent introduction of crystallographic dislocations in the underlying substrate, caused by lattice strain between silicon and silicon nitride. Active regions are then defined in the blanket silicon nitride layer by masking and etching to remove the silicon nitride in field regions. Active regions remain covered by silicon nitride, preventing subsequent oxidation of the underlying substrate. The field regions are then oxidized using an oxidizing ambient to form field oxide. Subsequent to LOCOS isolation, devices are formed in the active regions.

Conventionally, oxidation in a LOCOS process comprises utilizing an oxidizing ambient at atmospheric pressure. However, field oxide formed using atmospheric LOCOS techniques is plagued by lateral encroachment of oxide under the silicon nitride mask layer, forming a "bird's beak." Lateral encroachment is undesirable because it severely decreases semiconductor chip density. In order to fulfill consumer desires for faster microprocessors and other semiconductor chips, chip density must be maximized. Thus, the "bird's beak" problem prevents semiconductor devices from achieving their optimal electrical performance.

Many ways of decreasing such encroachment have been studied. One particularly effective method of alleviating the "bird's beak" phenomenon is by oxidizing the underlying substrate using pressures higher than conventionally-used atmospheric pressure. Oxide formed using high pressures is also less prone to crystal defects throughout the oxide layer. Crystal defects are undesirable because they allow diffusion through the oxide layer, potentially resulting in leakage currents that are detrimental to optimal device performance. For example, refresh times for dynamic random access memory arrays are optimized by decreasing leakage current from memory cells. Optimized refresh times are critical for faster electrical performance and lower power consumption. Power consumption is minimized because the memory cell array does not need to be refreshed as often when the leakage current is minimized.

While oxide formed using high pressure is relatively free of crystal defects, the oxide thinning effect prevents the effective use of oxide formed using high pressure, particularly in narrow pitch structures. The oxide thinning effect results in increased leakage current when thinning is severe. For illustration, given 0.6 $\mu$m pitch field oxide regions produced by a 0.25 $\mu$m process, the thickness of the field oxide is approximately 2,500 angstroms in the center of the field oxide regions, but only approximately 1,750 angstroms at the edges of the field oxide regions. This 70% thickness undesirably increases the leakage current through such field oxide regions. Narrow pitch structures are common in semiconductor integrated circuits, particularly memory and logic circuitry. Thus, oxide formed using high pressure has not been effectively used in such applications.

Another problem experienced with the use of high pressures for forming field oxide is that surface contamination often causes "hot spots" in the field oxide layer at the interface with the substrate. Contaminants, such as sodium, potassium, and fluorine are often undesirably introduced during the semiconductor fabrication process, particularly from deposition chambers and fueeaces. When such contaminants are present on a substrate during high pressure oxidation, they act as nucleation sites. Excess oxide growth occurs at such nucleation sites. High pressure oxidation significantly magnifies this problem. Excess growth has been known to cause field oxide regions on a wafer that are approximately 30 to 40% thicker than the rest of the field oxide. On large wafers, such excessive growth regions have been reported covering areas as large as a dime, and even a quarter. This is extremely undesirable because it causes problems with back end of line (BEOL) technology, particularly presenting step coverage problems for interconnect and metal line fabrication, severely decreasing yields, which increases fabrication cost.

There is a need for a method for forming field oxide having a low crystal defect density. There is a further need for a method for forming field oxide that is not adversely affected by the oxide thinning effect. A method to alleviate the "hot spot" effect seen when oxidizing substrates at high pressures is needed in order to take advantage of the advantageous effects of high pressure oxidation. As device density is becoming increasingly important and cost pressures increase, it is critical to provide isolation techniques having minimal leakage current and providing high yield.

SUMMARY OF THE INVENTION

The present invention teaches a method for forming field oxide using high pressure. As in a conventional LOCal Oxidation of Silicon (LOCOS) process, a substrate is blanketed with a blanket silicon nitride layer, supported by a pad oxide layer. Active regions are then defined in the substrate underlying the silicon nitride layer using conventional mask and etching techniques. Oxidation of field regions between the active regions is accomplished in a two-step process. A first oxide layer is formed in the field region. Then, a second oxide layer is formed, joining with the first oxide layer and consuming further silicon from the substrate. The second oxide layer is formed at a pressure of at least approxinmaely 5 atmospheres.

In one embodiment, the first oxide layer is formed at atmospheric pressure using a conventional oxidation technique, such as rapid thermal oxidation (RTO), wet oxidation, or dry oxidation. Temperatures of approximately 600 to 1,100 degrees Celsius are used for the oxidation step. The first oxide layer is formed to a thickness of approximately 1000 angstroms or less, and typically greater than 200 angstroms. The actual thickness will depend on the ratio of thickness to other layers that is desired.

In another embodiment, the first oxide layer is formed at or near atmospheric pressure, approximately 1 to 5 atmospheres. Wet or dry oxidation is used for the oxidizing ambient. Temperatures of approximately 600 to 1,100 degrees Celsius are used for the oxidation step. The first oxide layer is formed to a thickness of approximately 1000 angstroms or less, and typically greater than 200 angstroms. The pressure is then ramped upwards to form the second oxide layer.

Field oxide formed using the method of the invention has the best characteristics of both atmospheric pressure oxide and one-step high pressure oxide. The resulting field oxide has superior electrical characteristics to those of one-step high pressure oxidation. Since there is no thinning, improved device and substrate threshold voltage characteristics are obtained. The number of crystal defects in the total thickness of the field oxide is also minimized. Therefore, devices, such as memory cells, can be formed between field oxide produced using the method of the invention having a lower leakage current.

Structurally, resulting field oxide has similar characteristics to those of atmospheric pressure oxide. By forming the first oxide layer prior to the high pressure oxide, the "hot spot" effect is minimized, improving the uniformity of the resulting field oxide layer. The oxide thinning effect in such field oxide is also minimized to approximately 90% thickness, as compared to 70% thickness achieved using conventional one-step high pressure oxidation. Thus, this invention is critical for continued progress in optimizing electrical performance of integrated circuits by increasing device density and, thus, increasing device speed. It also results in a decrease in leakage current in dynamic random access memory devices, which allows for optimization in refresh times.

DESCRIPTION OF THE EMBODIMENTS

Figure 1A:
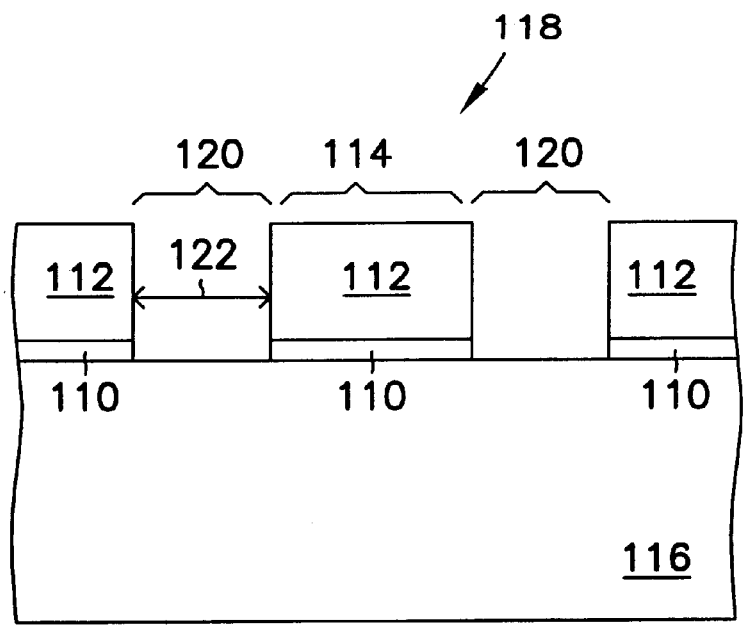
FIGS. 1A to 1E are structures illustrating field oxide formed using the method of the invention, and intermediate structures thereof.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Wafer and substrate are used interchangeably to refer to supporting semiconductor structures during processing. Both are to be understood as including silicon-on-sapphire (SOS) technology, silicon-on-insulator (SOI) technology, doped and undoped semiconductors, epitaxial layers of a silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined by the appended claims. Numbering in the Figures is usually done with the hundreds and thousands digits corresponding to the figure number, with the exception that the same components may appear in multiple figures. Scaling in the FIGS. is representative only and does not represent precise dimensions of the structures illustrated.

The present invention is practiced in a high pressure furnace, such as a GaSonics, Inc. Vertical High Pressure (VHP) furnace. While it is convenient to utilize a single furnace for the entire oxidation process, it is not necessary for the practice of this invention. A separate atmospheric furnace can be used for the first oxidation step in one embodiment of the invention.

To form field oxide regions between active areas on a substrate, the substrate is first prepared as in conventional LOCal Oxidation of Silicon (LOCOS) processing. Any type of LOCOS isolation scheme can be effectuated using the method of the invention. Therefore, slight variations from the example illustrated are not meant to be outside of the scope of the invention.

A thin blanket pad oxide layer 110 is formed on the substrate, followed by deposition of a blanket silicon nitride layer 112. Thereafter, the pad oxide layer 110 and the silicon nitride layer 112 are masked and etched using conventional patterning techniques, such as photolithography, to define active areas 114 on the substrate 116, the resulting structure 118 of which is partially illustrated in FIG. 1A. Field regions 120 are spaced between the active regions 114.

Spacing and dimensions of the field and active regions, 120 and 114, respectively, depend on the integrated circuit (IC) to be formed on the active regions 114 of the substrate 116. Structures having a narrow pitch, as well as those having a wide pitch, can be oxidized using the method of the invention. Due to the particularly beneficial uses of the present invention with narrow pitch structures, such as memory and logic ICs, examples will be illustrated with reference to such dimensions. However, the scope of the invention is not meant to be narrowed by way of these examples. Currently, in applications utilizing 0.25 μm technology, the width 122 of field regions 120 is typically approximately 0.3 μm for narrow pitch structures.

Figure 1B:
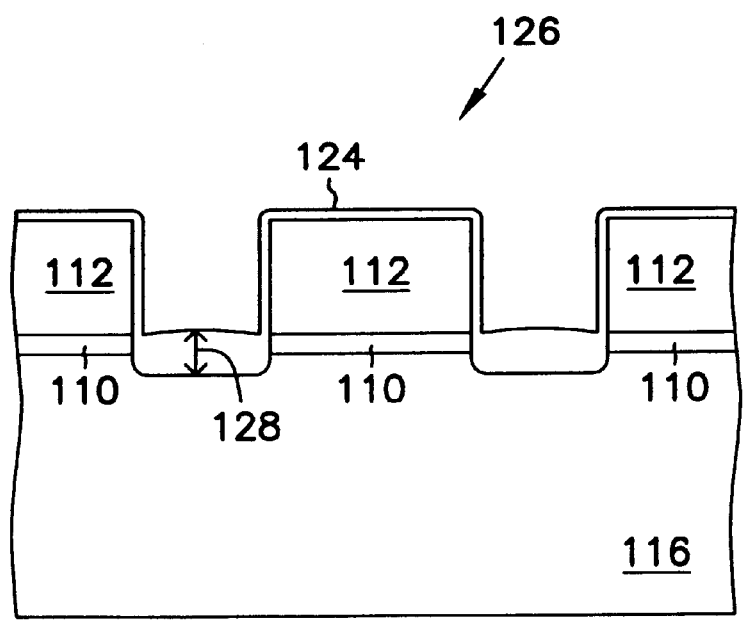

The structure illustrated in FIG. 1A is oxidized to form a first oxide layer 124, the resulting structure 126 of which is partially illustrated in FIG. 1B. The first oxide layer 124 is formed to a thickness 128 of approximately 1,000 angstroms or less. Typically, the thickness 128 of the first oxide layer is approximately 200 to 1,000 angstroms. However, it is adjusted according to the dimensions of the IC in which it is formed.

In one embodiment, the step of forming the first oxide layer 124 comprises oxidizing the substrate 116 in an oxidizing ambient at approximately atmospheric pressure (i.e., one atmosphere). The oxidizing ambient is selected from those common to wet and dry oxidation. Rapid thermal oxidation (RTO) can alternatively be used for forming the first oxide layer 124. Typically, wet oxidation is used for this first lower pressure oxidation step. The oxidation temperature needed is approximately 600 to 1,100 degrees Celsius. Adjustments to the oxidation temperature affect the time needed to form the first oxide layer 124. Higher temperatures result in faster oxidation. For example, using a steam ambient for wet oxidation at 1,000 degrees Celsius, oxidation time is typically approximately 2 hours for forming a first oxide layer 124 having a thickness 128 of approximately 0.3 μm.

In another embodiment, the step of forming the first oxide layer 124 comprises oxidizing the substrate 116 in an oxidizing ambient at a pressure near atmospheric pressure (i.e., one to five atmospheres). The oxidizing ambient is selected from those common to wet and dry oxidation. Typically, wet oxidation is used for this first lower pressure oxidation step. The oxidation temperature needed is approximately 600 to 1,100 degrees Celsius. The pressure and temperature of the furnace can be raised simultaneously or independently, in any order.

Figure 2:
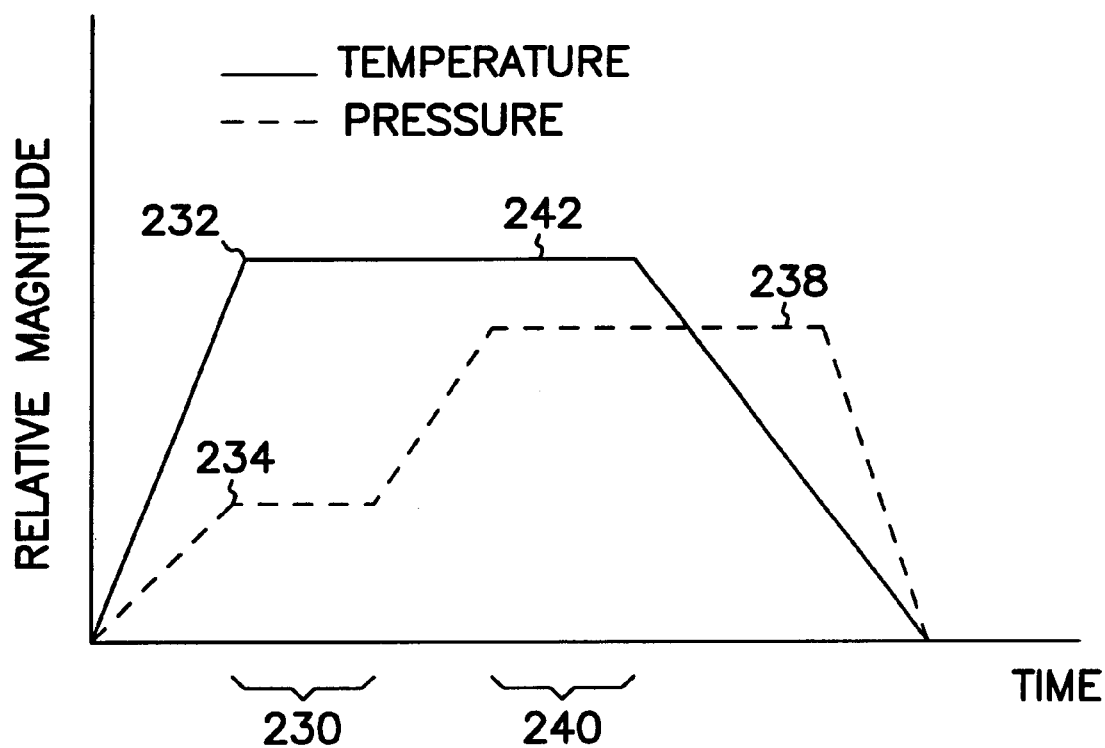
FIG. 2 is a graphical representation of relative magnitudes of temperature and pressure utilized in one embodiment of the invention versus time.

An example of the rates at which pressure and temperature are increased is illustrated in FIG. 2. In this example, pressure and temperature for the first oxidation step 230 are ramped simultaneously. Typically, the temperature of the furnace is ramped upwards at approximately 8° C./minute to an oxidation temperature 232. The ramp rate of the pressure is limited by the type of furnace used. For the VHP furnace, the maximum ramp rate is approximately 50 psi/minute. However, setting of the pressure ramp rate is relatively arbitrary. The pressure 234 of the first oxidation step is approximately one to five atmospheres.

The first oxide layer 124 formed according to both embodiments of the invention minimizes the "hot spot" effect by encapsulating any contaminants remaining on the field region 120 of the substrate 116 prior to oxidation. By forming lower pressure oxide 124 around such contaminants, excessive growth surrounding the contaminants is minimized, resulting in more uniform field oxide thickness over a wafer.

Figure 1C:
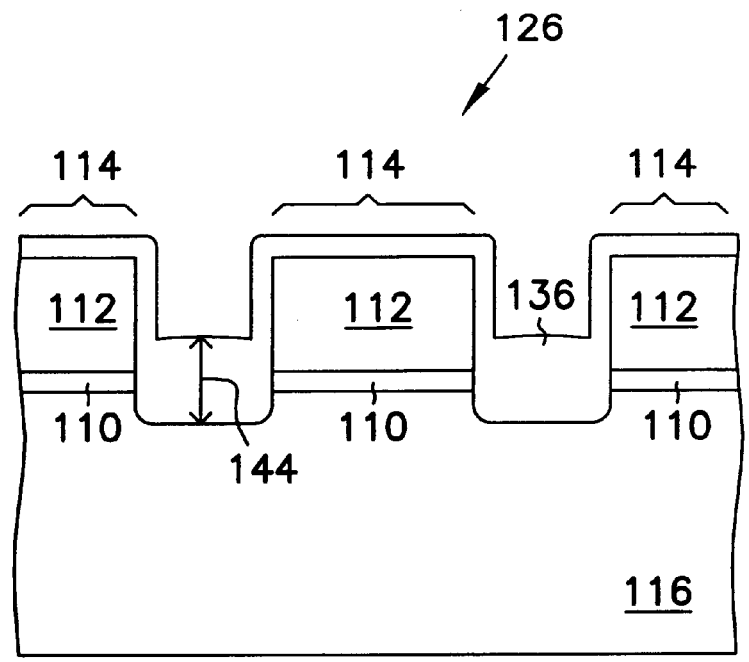

Next, the pressure of the furnace is increased in order to form a second oxide layer 136, which joins with the first oxide layer 124 and further consumes silicon from the substrate 116, the resulting structure of which is partially illustrated in FIG. 1C. The first oxide layer 124 is not shown as a single layer in the resulting second oxide layer 136 because the first oxide layer 124 is often interspersed with high pressure oxide. This is a result of the oxidation kinetics. Oxygen both diffuses through the first oxide layer 124 from the ambient simultaneously with the diffusion of silicon from the substrate 116 through the first oxide layer 124. The exact location of the reaction to form silicon oxide is variable and can occur within the first oxide layer 124, or on either side of the first oxide layer 124.

The ramp rate utilized to increase the pressure of the furnace is limited by the type of furnace used. For the VHP, the maximum ramp rate is approximately 50 psi/minute with a current maximum pressure of 25 atmospheres. However, setting of the pressure ramp rate is relatively arbitrary. The pressure 238 of the second oxidation step 240 is desired to be approximately 770 atmospheres or less, as illustrated in FIG. 2 in conjunction with the near atmospheric first oxidation step 230.

The oxidizing ambient utilized for this second oxidation step 240 can be either wet or dry, ambients which are well known to one skilled in the art. The temperature 242 of the second oxidation step 240 is approximately 600 to 1,100 degrees Celsius. It is not necessary that the oxidation temperature 232 for forming the second oxide layer 136 be the same as the oxidation temperature 242 for forming the first oxide layer 124. It can be increased or decreased, as desired. The ramp rate for increasing the temperature is often greater than that for increasing the temperature prior to the first oxidation step because convection heating mechanisms become more prevalent at pressures higher than approximately 10 atmospheres. Thus, such convection heating mechanisms combine with radiation heating mechanisms that are the dominant heating means at lower pressures. Thus, due to convection heating mechanisms, temperature ramp rates of up to approximately 25 to 30° C./minute are possible. The ramp rate for decreasing the temperature is limited by the design of the furnace.

The second oxidation step 240 forms a second oxide layer 136 having a total thickness 144 of approximately 2,000 to 3,000 angstroms for 0.25 $\mu$m technology. However, the thickness 144 of the second oxide layer 136 is adjusted according to the state of the technology. For example, for 0.35 $\mu$m technology, the thickness 144 of the second oxide layer 136 is approximately 3,000 to 4,000 angstroms. This second oxide layer 136 corresponds to field oxide, which isolates devices subsequently formed on the active areas 114 of the substrate 116.

Figure 1D:
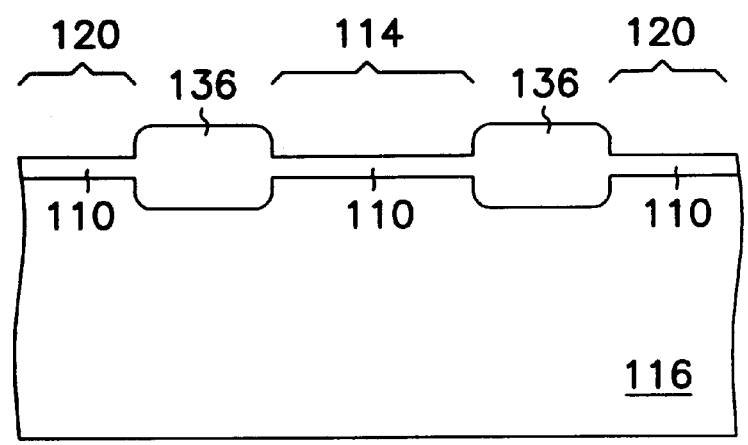

Subsequent to the second oxidation step 240, the temperature and pressure of the furnace are reduced at maximum rates of which are controlled by the design of the furnace. The wafers are removed and the silicon nitride layer 112 and excess oxide from the second oxide layer 136 are removed using an etchant, leaving only the pad oxide layer 110 on the active regions 114, as well known to one skilled in the art. The resulting structure of which is partially illustrated in FIG. 1D.

Figure 1E:
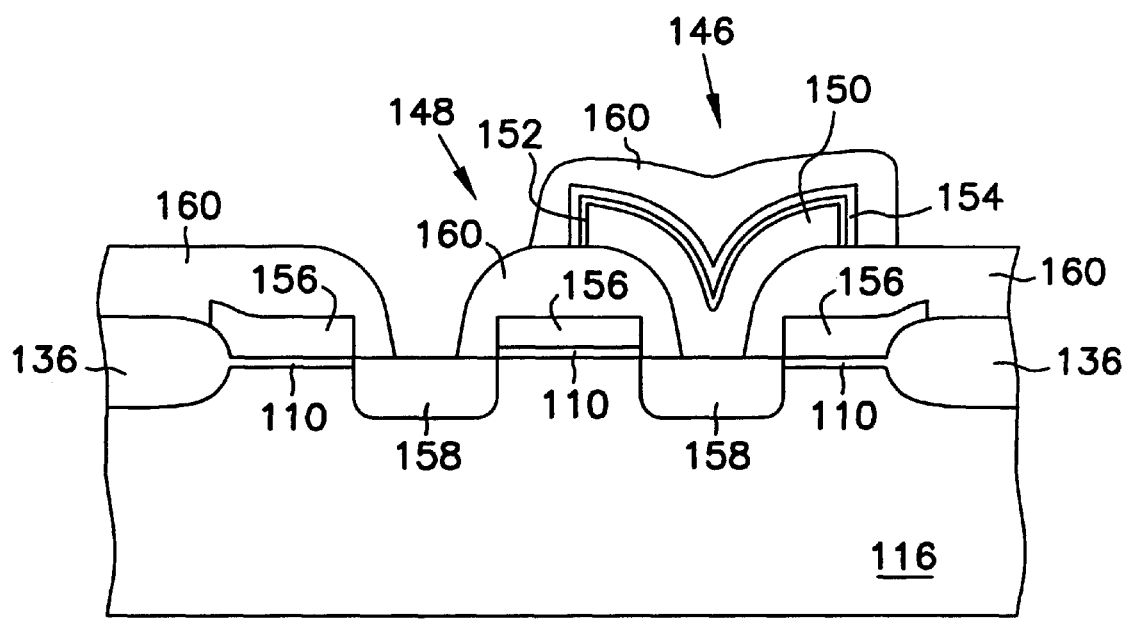

Desired circuitry, such as a memory cell array, is then formed in the active regions 114 of the substrate 116, the resulting structure of which is illustrated in FIG. 1E. Typically, in a dynamic random access memory array, a memory cell 146 is formed over an access transistor 148 within an active region 114. A memory cell 146 comprises a lower plate electrode 150, a capacitive dielectric film 152, and an upper plate electrode 154. However, the placement and configuration of the memory cell 146 can be changed as well known to one skilled in the art. The access transistor 148 comprises a gate 156 formed over the gate oxide layer 110 and having source/drain regions 158 situated on both sides of the gate structure 156. The gate 156 material is typically polysilicon, which is deposited elsewhere on the active region 114 also. Insulative material 160, such as borophosphosilicate glass (BPSG), insulates the memory cell 146 and access transistor 148 within an active region 114.

Field oxide 136 formed using the method of the invention has the best characteristics from both prior atmospheric pressure oxide and one-step high pressure oxide. Electrically, resulting field oxide 136 has similar characteristics to those of one-step high pressure oxidation. The number of crystal defects in the total thickness 144 of the field oxide 136 is minimized. The minimization of crystal defects results in desirably lower leakage current between devices in an IC. For example, refresh times for dynamic random access memory arrays are optimized by decreasing leakage current between memory cells. Optimized refresh times are critical for faster electrical performance and lower power consumption. Power consumption is minimized because the memory cell array does not need to be refreshed as often when the leakage current is minimized.

Structurally, resulting field oxide 136 has similar characteristics to those of atmospheric pressure oxide. By forming the first oxide layer 124 prior to the high pressure oxide, the "hot spot" effect is minimized, improving the uniformity of the resulting field oxide layer 136. The oxide thinning effect in such field oxide 136 is also minimized to approximately 90% thickness, as compared to 70% thickness achieved using conventional one-step high pressure oxidation. The presence of first oxide layer 124 also minimizes encroachment of the field oxide 136 under the silicon nitride layer 112 during its formation. Such encroachment undesirably results in a "bird's beak" structure. Thus, this invention is critical for continued progress in optimizing electrical performance of integrated circuits by increasing device density and, thus, increasing device speed.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for fabricating a memory cell array on a semiconductor substrate, comprising the steps of:
    forming a first oxide layer on the semiconductor substrate at a first pressure;
    defining a plurality of active areas on the semiconductor substrate;
    forming a second oxide layer joined with the first oxide layer in field regions spaced between the active regions, wherein the second oxide layer is formed in the field regions at a second pressure which is substantially greater than the first pressure; and
    forming a plurality of memory cells on the plurality of active areas.

2. The method of claim 1, wherein the first pressure is approximately atmospheric pressure.

3. The method of claim 1, wherein the second pressure is approximately greater than five atmospheres.

4. A method for fabricating a memory cell array on a semiconductor substrate, comprising the steps of:
    forming a first oxide layer on the semiconductor substrate;
    defining a plurality of active areas on the semiconductor substrate;
    forming a second oxide layer joined with the first oxide layer in field regions spaced between the active regions, wherein the second oxide layer is formed in the field regions at an increased pressure; and
    forming a plurality of memory cells on the plurality of active areas.

5. The method of claim 4, wherein the increased pressure is approximately greater than five atmospheres.

6. The method of claim 4, wherein the first oxide layer is formed to a thickness of approximately 1,000 angstroms or less.

7. The method of claim 4, wherein the first oxide layer is formed to a thickness of approximately 200 angstroms or greater.

8. The method of claim 4, wherein the first oxide layer is formed at approximately one to five atmospheres.

9. The method of claim 4, wherein the first oxide layer is formed using a wet oxide ambient and the second oxide layer is formed using a dry oxide ambient.

10. A method for fabricating a memory cell array on a semiconductor substrate, comprising the steps of:
    forming a first oxide layer on the semiconductor substrate;
    defining a plurality of active areas on the semiconductor substrate;
    forming a second oxide layer interspersed with the first oxide layer in field regions spaced between the active regions, wherein the second oxide layer is formed in the field regions at a pressure of at least approximately five atmospheres; and
    forming a plurality of memory cells on the plurality of active areas.

11. The method in claim 10, wherein the first oxide layer is formed at approximately one five atmospheres.

12. The method in claim 10, wherein the first oxide layer is formed to a thickness of 1,000 angstroms of less.

13. A method for fabricating a memory cell array on a semiconductor substrate, comprising the steps of:
    forming an oxide layer on the semiconductor substrate at a first pressure;
    defining a plurality of active areas on the semiconductor substrate;
    increasing the first pressure to a second pressure and continuing to form the oxide layer in field regions spaced between the active regions, wherein the second pressure is at least approximately five atmospheres; and
    forming a plurality of memory cells on the plurality of active areas.

14. The method in claim 13, wherein the first oxide layer is formed to a thickness of approximately 1,000 angstroms or less.

15. The method in claim 13, wherein the first oxide layer is formed to a thickness of approximately 200 angstroms or greater.

16. The method in claim 13, wherein the first oxide layer is formed at approximately one to five atmospheres.

17. The method in claim 13, wherein the first oxide layer is formed using a wet oxide ambient and the second oxide layer is formed using a dry oxide ambient.

18. A method for fabricating a memory cell array on a semiconductor substrate, comprising the steps of:
    defining a plurality of active areas on the semiconductor substrate between field areas;
    forming a first oxide layer on the semiconductor substrate in the field areas encapsulating contaminants remaining in the field areas;
    forming a second oxide layer interspersed with the first oxide layer, wherein the second oxide layer is formed at an elevated pressure; and
    forming a plurality of memory cells on the plurality of active areas.

19. The method in claim 18, wherein the first oxide layer is formed at approximately one to five atmospheres.

20. The method in claim 18, wherein the first oxide layer is formed to a thickness of 1,000 angstroms or less.

21. A method for fabricating a memory cell array on a semiconductor substrate, comprising the steps of:
    forming a first oxide layer on the semiconductor substrate at a first pressure;
    defining a plurality of active areas on the semiconductor substrate;
    forming a second oxide layer joined with the first oxide layer in isolation regions spaced between the active regions, wherein the second oxide layer is formed in the isolation regions at a second pressure which is substantially greater than the first pressure; and
    forming a plurality of memory cells on the plurality of active areas.

22. The method of claim 21, wherein the first pressure is approximately atmospheric pressure.

23. The method of claim 21, wherein the second pressure is approximately greater than five atmospheres.

24. A method for fabricating a memory cell array on a semiconductor substrate, comprising the steps of:
    forming a first oxide layer on the semiconductor substrate;
    defining a plurality of active areas on the semiconductor substrate;

forming a second oxide layer joined with the first oxide layer in isolation regions spaced between the active regions, wherein the second oxide layer is formed in the isolation regions at an increased pressure; and forming a plurality of memory cells on the plurality of active areas.

25. The method of claim 24, wherein the increased pressure is approximately greater than five atmospheres.

26. The method in claim 24, wherein the first oxide layer is formed to a thickness of approximately 1,000 angstroms or less.

27. The method in claim 24, wherein the first oxide layer is formed to a thickness of approximately 200 angstroms or greater.

28. The method in claim 24, wherein the first oxide layer is formed at approximately one to five atmospheres.

29. The method in claim 24, wherein the first oxide layer is formed using a wet oxide ambient and the second oxide layer is formed using a dry oxide ambient.

30. A method for fabricating a memory cell array on a semiconductor substrate, comprising the steps of:

forming a first oxide layer on the semiconductor substrate;

defining a plurality of active areas on the semiconductor substrate;

forming a second oxide layer interspersed with the first oxide layer in isolation regions spaced between the active regions, wherein the second oxide layer is formed in the isolation regions at a pressure of at least approximately five atmospheres; and forming a plurality of memory cells on the plurality of active areas.

31. The method in claim 30, wherein the first oxide layer is formed at approximately one to five atmospheres.

32. The method in claim 30, wherein the first oxide layer is formed to a thickness of 1,000 Angstroms or less.

33. A method for fabricating a memory cell array on a semiconductor substrate, comprising the steps of:

forming an oxide layer on the semiconductor substrate at a first pressure;

defining a plurality of active areas on the semiconductor substrate;

increasing the first pressure to a second pressure and continuing to form the oxide layer in isolation regions spaced between the active regions, wherein the second pressure is at least approximately five atmospheres; and forming a plurality of memory cells on the plurality of active areas.

34. The method in claim 33, wherein the first oxide layer is formed to a thickness of approximately 1,000 angstroms or less.

35. The method in claim 33, wherein the first oxide layer is formed to a thickness of approximately 200 angstroms or greater.

36. The method in claim 33, wherein the first oxide layer is formed at approximately one to five angstroms.

37. The method in claim 33, wherein the first oxide layer is formed using a wet oxide ambient and the second oxide layer is formed using a dry oxide ambient.

38. A method for fabricating a memory cell array on a semiconductor substrate, comprising the steps of:

defining a plurality of active areas on the semiconductor substrate between isolation areas;

forming a first oxide layer on the semiconductor substrate in the isolation areas encapsulating contaminants remaining in the isolation areas;

forming a second oxide layer interspersed with the first oxide layer, wherein the second oxide layer is formed at an elevated pressure; and forming a plurality of memory cells on the plurality of active areas.

39. The method in claim 38, wherein the first oxide layer is formed at approximately one to five atmospheres.

40. The method in claim 38, wherein the first oxide layer is formed to a thickness of 1,000 angstroms or less.

\* \* \* \* \*